(12) United States Patent
Hosomi et al.

(10) Patent No.: US 8,900,478 B2
(45) Date of Patent: Dec. 2, 2014

(54) ETCHANT AND METHOD FOR MANUFACTURING SEMICONDUCTOR DEVICE USING SAME

(75) Inventors: Akira Hosomi, Tokyo (JP); Kensuke Ohmae, Tokyo (JP)

(73) Assignee: Mitsubishi Gas Chemical Company, Inc., Tokyo (JP)

(*) Notice: Subject to any disclaimer, the term of this patent is extended or adjusted under 35 U.S.C. 154(b) by 27 days.

(21) Appl. No.: 13/516,524

(22) PCT Filed: Dec. 14, 2010

(86) PCT No.: PCT/JP2010/072506
§ 371 (c)(1),
(2), (4) Date: Jun. 15, 2012

(87) PCT Pub. No.: WO2011/074589
PCT Pub. Date: Jun. 23, 2011

(65) Prior Publication Data
US 2012/0261608 A1 Oct. 18, 2012

(30) Foreign Application Priority Data
Dec. 15, 2009 (JP) .................. 2009-284173

(51) Int. Cl.
*C09K 13/00* (2006.01)
*H01L 23/00* (2006.01)
(Continued)

(52) U.S. Cl.
CPC . *H01L 21/32134* (2013.01); *H01L 2924/01013* (2013.01); *H01L 2224/13144* (2013.01);
(Continued)

(58) Field of Classification Search
USPC ........... 252/79.1–79.4; 438/745, 750, 694; 216/83, 100, 105
See application file for complete search history.

(56) References Cited

U.S. PATENT DOCUMENTS 6,218,281 B1 4/2001 Watanabe et al.
6,511,901 B1* 1/2003 Lam et al. ............ 438/612
(Continued)

FOREIGN PATENT DOCUMENTS

DE 10 2005 038 414 A1 2/2007
JP 11 195665 7/1999
(Continued)

OTHER PUBLICATIONS

International Search Report Issued Mar. 15, 2011 in PCT/JP10/072506 Filed Dec. 14, 2010.
(Continued)

*Primary Examiner* — Duy Deo
*Assistant Examiner* — Maki Angadi
(74) *Attorney, Agent, or Firm* — Oblon, Spivak, McClelland, Maier & Neustadt, L.L.P.

(57) ABSTRACT

Disclosed are an etchant which is used for redistribution of a semiconductor substrate having an electrode and which is capable of selectively etching copper without etching nickel; and a method for manufacturing a semiconductor device using the same. Specifically disclosed are an etchant which is used for redistribution of a semiconductor substrate and which contains hydrogen peroxide and citric acid and has a content of hydrogen peroxide of from 0.75 to 12% by mass and a content of citric acid of from 1 to 20% by mass, with a molar ratio of hydrogen peroxide and citric acid being in the range of from 0.3 to 5; an etchant for selective etching of copper which is used for redistribution of a semiconductor substrate and which contains hydrogen peroxide and malic acid and has a content of hydrogen peroxide of from 0.75 to 12% by mass and a content of malic acid of from 1.5 to 25% by mass, with a molar ratio of hydrogen peroxide and malic acid being in the range of from 0.2 to 6; and a method for manufacturing a semiconductor device using such an etchant.

17 Claims, 8 Drawing Sheets

(51) Int. Cl.
*C23F 1/02* (2006.01)
*C23F 1/18* (2006.01)
*H01L 21/3213* (2006.01)
*H01L 23/31* (2006.01)
*H01L 23/525* (2006.01)

(52) U.S. Cl.
CPC ............ H01L 2924/01005 (2013.01); *H01L 2224/13007* (2013.01); *H01L 2924/01019* (2013.01); *H01L 2924/01033* (2013.01); *H01L 2224/1147* (2013.01); *H01L 2224/02311* (2013.01); *H01L 2224/03914* (2013.01); *H01L 2224/03614* (2013.01); *H01L 2924/01029* (2013.01); *H01L 2224/13147* (2013.01); *H01L 2224/13083* (2013.01); *H01L 2924/01004* (2013.01); *H01L 2224/13082* (2013.01); *H01L 2224/05548* (2013.01); *H01L 2224/131* (2013.01); *H01L 2224/0347* (2013.01); *H01L 2224/03462* (2013.01); *H01L 2924/00013* (2013.01); H01L 24/11 (2013.01); *H01L 2224/05124* (2013.01); *C23F 1/02* (2013.01); *H01L 2224/02331* (2013.01); *H01L 2224/05027* (2013.01); *H01L 2224/05008* (2013.01); *H01L 2924/01079* (2013.01); *H01L 2224/05166* (2013.01); *H01L 23/3114* (2013.01); *H01L 2924/014* (2013.01); *H01L 2224/11912* (2013.01); *H01L 2224/11462* (2013.01); *C23F 1/18* (2013.01); H01L 24/05 (2013.01); *H01L 2224/11334* (2013.01); H01L 24/03 (2013.01); *H01L 2924/01006* (2013.01); *H01L 2224/13155* (2013.01); *H01L 2924/01082* (2013.01); H01L 24/13 (2013.01); *H01L 2924/01074* (2013.01); *H01L 2224/1191* (2013.01); *H01L 2224/05647* (2013.01); *H01L 23/525* (2013.01); *H01L 2224/02313* (2013.01); *H01L 2924/01075* (2013.01); *H01L 224/05144* (2013.01); *H01L 2224/05147* (2013.01); *H01L 2224/05572* (2013.01); *H01L 2224/03916* (2013.01); *H01L 2224/0239* (2013.01)

USPC ....... 252/79.1; 252/79.2; 252/79.3; 252/79.4; 438/745; 438/750; 438/694; 216/83; 216/100; 216/105

(56) References Cited

U.S. PATENT DOCUMENTS

| | | | |
|---|---|---|---|
| 7,465,408 B1 * | 12/2008 | Avanzino | 216/100 |
| 8,058,712 B2 * | 11/2011 | Hamamoto et al. | 257/659 |
| 8,372,757 B2 * | 2/2013 | Mayer et al. | 438/754 |
| 2002/0048953 A1 | 4/2002 | Nayak | |
| 2002/0096764 A1 * | 7/2002 | Huang | 257/737 |
| 2005/0140004 A1 | 6/2005 | Ishiguri et al. | |
| 2010/0304573 A1 | 12/2010 | Fluegge et al. | |

FOREIGN PATENT DOCUMENTS

| | | |
|---|---|---|
| JP | 2001 53075 | 2/2001 |
| JP | 2005 175128 | 6/2005 |
| JP | 2006 120664 | 5/2006 |
| JP | 2006-120931 A | 5/2006 |

OTHER PUBLICATIONS

U.S. Appl. No. 13/518,714, filed Jun. 22, 2012, Hosomi.
Extended European Search Report issued Jun. 25, 2013 in Patent Application No. 10837615.3.

* cited by examiner

ETCHANT AND METHOD FOR MANUFACTURING SEMICONDUCTOR DEVICE USING SAME

TECHNICAL FIELD

The present invention relates to an etchant which is used for the manufacture of a semiconductor device using a semiconductor substrate having an electrode and which is capable of selectively etching copper without etching nickel, and to a method for manufacturing a semiconductor device using the same.

BACKGROUND ART

In recent years, following the requirements for downsizing of electronic appliances, downsizing, high integration and multi-functionalization of semiconductor devices to be used for the electronic appliances are being rapidly advanced, and the number of electrodes which connect a semiconductor device and an electronic appliance to each other tends to increase. As the semiconductor device to be used herein, those which are redistributed on a semiconductor pad formed of aluminum or the like and provided with a bump electrode are frequently used. In order to simultaneously cope with the downsizing of the semiconductor device and the increase of the electrode number as described above, there are proposed a variety of formation methods of a bump electrode (for example, Patent Documents 1 and 2).

In these formation methods of a bump electrode, there may be the case where an etching step of a wiring to be provided on a semiconductor pad (hereinafter also referred to merely as "electrode") is present, and copper must be etched without etching nickel which is used for the wiring.

More specifically, the formation method of a bump electrode disclosed in Patent Document 1 includes a step of etching, in which on a substrate provided with an electrode which is constituted of an electrically conductive material, a cover film which is opened in the electrode portion is provided; a base electrically conductive film formed by sputtering copper or the like, a photoresist film having an opening extending from the electrode to an area on which a bump electrode is formed, and a copper wiring and a nickel wiring in the opening by electrolytic plating are successively provided; the photoresist film is then removed; and a portion of the base electrically conductive film, which is not covered by the wirings, is etched. In etching copper which forms the base electrically conductive film in the step of etching, in order to ensure higher performances, it is desirable that the nickel wiring formed by electrolytic plating is not etched.

Also, the formation method of a bump electrode disclosed in Patent Document 2 includes an etching step in which on a semiconductor substrate having an aluminum electrode provided therewith, a seed layer is formed of titanium or copper by means of sputtering; a resist in which a portion for forming a bump electrode is opened is formed; a barrier metal layer obtained by laminating plural metals such as titanium, copper, nickel, etc. is formed in the opened area by means of electrolytic plating or the like; solder working as a bump electrode is further formed thereon by means of electrolytic plating; the resist is then removed; and the seed layer is subsequently etched. In etching titanium or copper which forms the seed layer in the step of etching, in order to ensure higher performances, it is desirable that the metal which forms the barrier metal layer, such as nickel, etc., is not etched.

But, in the etching step of Patent Document 1 or Patent Document 2, an etchant which is used in the step is not sufficiently reviewed, and in etching the member such as the wiring composed of copper, or the like, even the member composed of nickel is etched, too. As described above, with the progress of downsizing, high integration and multi-functionalization of semiconductor devices, required performances by a customer who uses the semiconductor device are becoming severe. Then, in semiconductor devices which are manufactured by a conventional manufacturing method of semiconductor devices, the tendency that the case where the required performances cannot be sufficiently satisfied is caused has become remarkable.

Patent Document 1: JP-A-11-195665
Patent Document 2: JP-A-2005-175128

EXPLANATIONS OF LETTERS OR NUMERALS

Figure 1A:
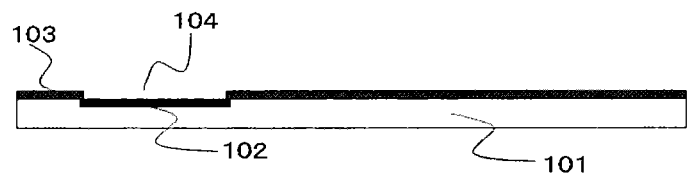
FIGS. 1A-1H are sectional schematic views of every step of a semiconductor device for explaining Manufacturing Method A of a semiconductor device having a bump electrode of the present invention.

101, 201, 301, 401: Silicon substrate
102, 202, 302, 402: Electrode
103, 203, 303, 304: Insulating film
104, 204, 304, 404: Opening
105, 205, 305, 405: Titanium layer
106, 206, 306, 406: Copper layer
107: Photoresist (I)
108, 208, 308, 408: Opening
109, 209, 409: Copper layer
110: Photoresist (II)
111, 211: Opening
112, 210, 309, 410: Nickel layer
113, 310, 411: Gold layer
114, 212: Insulating film 116: Residue of copper layer
117, 311, 412: Concave
207, 307, 407: Photoresist
213: Bump electrode
214: Shoulder cutting

SUMMARY OF THE INVENTION

Problems to be Solved by the Invention

Under such circumstances, the present invention has been made, and its object is to provide an etchant which is used for the manufacture of a semiconductor device using a semiconductor substrate having an electrode and which is capable of selectively etching copper without etching nickel and a method for manufacturing a semiconductor device using the same.

Means for Solving the Problems

In order to achieve the foregoing object, the present inventors made extensive and intensive investigations. As a result, it has been found that the foregoing problems can be solved by using an etchant containing hydrogen peroxide and, as an organic acid component, a specified hydroxy acid, namely citric acid or malic acid, in a specified composition. That is, the present invention is to provide an etchant which is used for the manufacture of a semiconductor device using a semiconductor substrate having an electrode and which is capable of selectively etching copper without etching nickel and a method for manufacturing a semiconductor device using the same.

[1] An etchant for selective etching of copper which is used for the manufacture of a semiconductor device using a semiconductor substrate having an electrode, comprising hydrogen peroxide and citric acid and having a content of hydrogen peroxide of from 0.75 to 12% by mass and a content of citric acid of from 1 to 20% by mass, with a molar ratio of hydrogen peroxide and citric acid being in the range of from 0.3 to 5.

[2] An etchant for selective etching of copper which is used for the manufacture of a semiconductor device using a semiconductor substrate having an electrode, comprising hydrogen peroxide and malic acid and having a content of hydrogen peroxide of from 0.75 to 12% by mass and a content of malic acid of from 1.5 to 25% by mass, with a molar ratio of hydrogen peroxide and malic acid being in the range of from 0.2 to 6.

[3] The etchant for selective etching of copper as set forth above in [1], wherein the content of hydrogen peroxide is from 1.5 to 7% by mass, the content of citric acid is from 2 to 15% by mass, and the molar ratio of hydrogen peroxide and citric acid is in the range of from 0.3 to 5.

[4] The etchant for selective etching of copper as set forth above in [2], wherein the content of hydrogen peroxide is from 1.5 to 4.5% by mass, the content of malic acid is from 1 to 15% by mass, and the molar ratio of hydrogen peroxide and malic acid is in the range of from 0.3 to 6.

[5] A method for manufacturing a semiconductor device, comprising an etching step using the etchant for selective etching of copper as set forth above in any one of [1] to [4].

[6] The method for manufacturing a semiconductor device as set forth above in [5], wherein the semiconductor device has a bump electrode.

[7] The method for manufacturing a semiconductor device as set forth above in [5] or [6], comprising a redistribution layer forming step of forming a wiring on the electrode of the semiconductor substrate having an electrode.

[8] The method for manufacturing a semiconductor device as set forth above in any one of [5] to [7], wherein the semiconductor device has a wiring to be formed using copper.

Effects of the Invention

According to the present invention, an etchant which is used for a manufacturing step of a semiconductor device using a semiconductor substrate having an electrode and which is capable of selectively etching copper without etching nickel and a method for manufacturing a semiconductor device using the same can be provided.

BEST MODES FOR CARRYING OUT THE INVENTION

[Etchant]
The etchant of the present invention is a liquid which is used in an etching step in a manufacturing step of a semiconductor device using a semiconductor substrate having an electrode and which contains hydrogen peroxide and, as an organic acid component, citric acid or malic acid that is a specified hydroxy acid and has a specified composition.

In the case where the etchant of the present invention contains citric acid as the organic acid component, it is required that a content of hydrogen peroxide is from 0.75 to 12% by mass, and a content of citric acid is from 1 to 20% by mass, with a molar ratio of hydrogen peroxide and citric acid being in the range of from 0.3 to 5. So far as the contents of the respective components in the etchant fall within the foregoing ranges, the control of hydrogen peroxide is easy; the concentration of hydrogen peroxide is stable; an appropriate etching rate and satisfactory etching performances are obtained; and it is possible to selectively etch copper without etching nickel. From the same viewpoints, it is preferable that the content of hydrogen peroxide is from 1 to 9% by mass, and the content of citric acid is from 2 to 20% by mass, with the molar ratio of hydrogen peroxide and citric acid being in the range of from 0.2 to 6; and it is more preferable that the content of hydrogen peroxide is from 1.5 to 7% by mass, and the content of citric acid is from 2 to 15% by mass, with the molar ratio of hydrogen peroxide and citric acid being in the range of from 0.3 to 5.

In the case where the etchant of the present invention contains malic acid as the organic acid component, it is required that a content of hydrogen peroxide is from 0.75 to 12% by mass, and a content of malic acid is from 1.5 to 25% by mass, with a molar ratio of hydrogen peroxide and malic acid being in the range of from 0.2 to 6. So far as the contents of the respective components in the etchant fall within the foregoing ranges, the control of hydrogen peroxide is easy; the concentration of hydrogen peroxide is stable; an appropriate etching rate and satisfactory etching performances are obtained; and it is possible to selectively etch copper without etching nickel. From the same viewpoints, it is preferable that the content of hydrogen peroxide is from 1 to 9% by mass, and the content of malic acid is from 2 to 20% by mass, with the molar ratio of hydrogen peroxide and malic acid being in the range of from 0.2 to 6; and it is more preferable that the content of hydrogen peroxide is from 1.5 to 4.5% by mass, and the content of malic acid is from 1 to 15% by mass, with the molar ratio of hydrogen peroxide and malic acid being in the range of from 0.3 to 6.

The etchant of the present invention preferably contains water as other component than hydrogen peroxide and the organic acid component. As the water, water from which metal ions, organic impurities, particle grains, and the like have been removed by means of distillation, an ion exchange treatment, a filter treatment, an adsorption treatment of various sort, or the like is preferable. In particular, pure water and ultra-pure water are preferable.

The etchant of the present invention has such a characteristic feature that it selectively etches copper without etching nickel. Accordingly, the etchant of the present invention is suitably used for the etching step in the manufacturing step of a semiconductor device which uses nickel and copper and which is required to selectively etch copper without etching nickel especially among semiconductor devices.

[Manufacturing Method of Semiconductor Device]

The manufacturing method of a semiconductor device of the present invention includes an etching step using the etchant of the present invention, and it is preferable that the semiconductor device has a bump electrode. Also, from the viewpoint of effectively utilizing the characteristic feature of the etchant of the present invention, which is capable of selectively etching copper without etching nickel, it is preferable that the etching step is characterized in that a member composed of nickel and a member composed of copper are in such a state that the both can be brought into contact with the etchant at the same time; and that the member composed of copper is etched. The manufacturing method of the present invention is hereunder more specifically described.

<<Manufacturing Method A of Semiconductor Device>>

A first embodiment of the manufacturing method of a semiconductor device of the present invention (hereinafter referred to as "Manufacturing Method A") includes a seed layer forming step A1; a photoresist (I) forming step A2; a redistribution layer forming step A3; a photoresist (II) forming step A4; a bump electrode forming step A5; and an etching step A6 using the etchant of the present invention in this order. Manufacturing Method A of the present invention is described in detail by reference to FIGS. 1A-1H and FIGS. 2A-2H.

(Step A1)

Step A1 is a seed layer forming step of providing, on a semiconductor substrate having an electrode provided therewith, an insulating film having an opening from which the electrode is exposed, and further forming a seed layer on the opening and the insulating film. As shown in FIG. 1A, the semiconductor substrate having an electrode provided therewith as referred to herein is one in which an electronic circuit containing a semiconductor device which is manufactured by a well-known manufacturing method is, for example, formed on a surface of a silicon substrate 101, and an electrode 102 composed of an electrically conductive material such as, for example, aluminum, etc., which is called a pad, is formed on the surface on which the electronic circuit is formed. In addition to aluminum, aluminum alloys having titanium or copper added thereto, copper or copper alloys, gold, and the like can also be preferably exemplified as the electrically conductive material.

On the semiconductor 101 having this electrode 102 provided therewith (the surface on which the electrode is formed), an insulating film 103 composed of silicon oxide, etc. is formed, and in the insulating film 103, an opening 104 corresponding to the electrode 102 is formed so as to expose the electrode 102.

Figure 1B:
Figure 1C:

Subsequently, as shown in FIGS. 1B-1C, a seed layer is formed on the opening 104 and the insulating film 103 usually by means of sputtering. As a metal for forming the seed layer, titanium, copper, and the like are preferably exemplified, and as shown in FIGS. 1B-1C, a layer such as a layer made of such a metal, a titanium layer 105, or a copper layer 106 can be provided in a plural number. Also, from the viewpoints of the adhesion to the electrode 102 and the fabrication control of a semiconductor device, it is preferable to provide the titanium layer 105 on the substrate.

(Step A2)

Figure 1D:
Figure 1E:

Step A2 is a photoresist (I) forming step of opening a region including an area which is provided on the electrode of the seed layer and an area for forming a bump electrode and forming a photoresist (I) 107 having an opening 108 for exposing the seed layer. First of all, as shown in FIG. 1D, the photoresist (I) 107 is formed on the copper layer 106. Subsequently, as shown in FIG. 1E, by exposing with light and developing, the photoresist (I) 107 having the opening 108 for forming a redistribution layer connecting to a region including the area which is provided on the electrode 102 of the seed layer and the area for forming a bump electrode as described later is formed.

(Step A3)

Figure 1F:
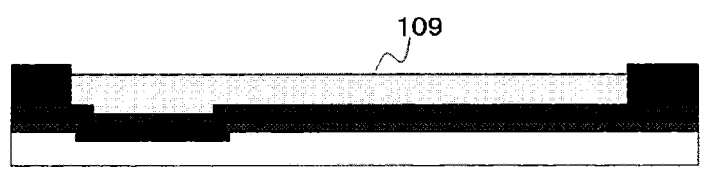

Step A3 is a redistribution layer forming step of providing a wiring on the opening 108 to perform redistribution. According to this redistribution layer forming step, a redistribution layer for forming a wiring on the electrode 102 of the semiconductor substrate 101 having the electrode 102 is formed. A material such as copper, nickel, etc. is used for the wiring, and as shown in FIG. 1F, it is preferable that the wiring has a copper layer 109 formed of at least copper. Also, the wiring is in general provided by an electrolytic plating treatment of copper or nickel.

(Step A4)

Figure 1G:
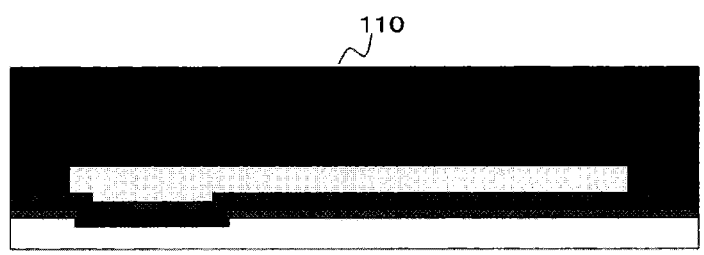
Figure 1H:
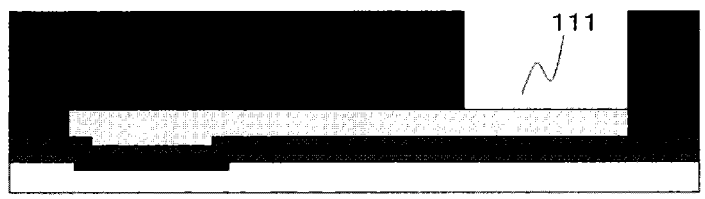

As shown in FIGS. 1G-1H, Step A4 is a photoresist (II) forming step of removing the photoresist (I) 107 formed in Step A3 to form a photoresist (II) 110 so as to cover the seed layer and the wiring and further performing exposure with light and development to form an opening 111 for forming a bump electrode on the photoresist (II) 110. This photoresist (II) 110 may be provided in the usual way.

(Step A5)

Figure 2A:
FIGS. 2A-2H are sectional schematic views of every step of a semiconductor device for explaining Manufacturing Method A of a semiconductor device having a bump electrode of the present invention.

As shown in FIGS. 2A-AB, Step 5A is a bump electrode forming step of providing the opening 111 in an area for forming a bump electrode of the photoresist (II) 110 in such a manner that the copper layer 109 of the redistribution layer is exposed and forming a bump electrode having at least one layer of a nickel layer 112 composed of nickel in the opening 111.

Figure 2B:

The bump electrode can be formed by using, in addition to tin, lead or an alloy thereof (tin-lead alloy), gold, palladium, nickel, copper, etc. by means of electrolytic plating, and can be formed of a single layer or plural layers. For example, as shown in FIG. 2B, after providing the nickel layer 112, a gold layer 113 is provided, whereby the bump electrode can be formed. In the manufacturing method of the present invention, when the at least one layer which forms the bump electrode is the nickel layer 112 composed of nickel, the performance to enable selective etching of copper without etching nickel which the etchant of the present invention has, can be effectively utilized.

(Step A6)

Figure 2C:
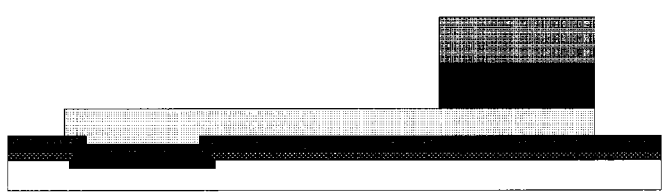
Figure 2D:
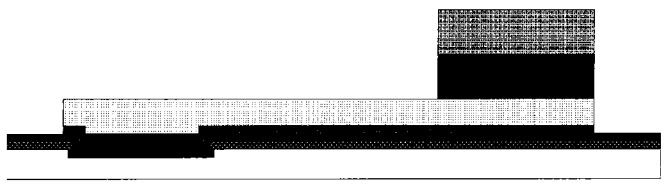
Figure 2E:
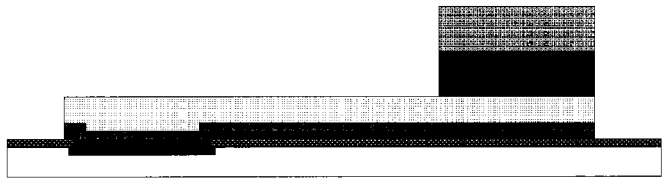

Step A6 is an etching step of after removing the photoresist (II) 110 as shown in FIG. 2C, further etching an exposed portion which is not covered by the wiring such as the copper layer 109 in the seed layer such as the titanium layer 105, the copper layer 106, etc. as shown in FIGS. 2D-2E. In the etching step, it is required that the etchant of the present invention is used. By using the etchant of the present invention, the control of hydrogen peroxide in the etchant is easy; an appropriate etching rate and satisfactory etching performances are obtained; and it is possible to selectively etch copper without etching nickel.

A method of bringing the etchant into contact with an etching object is not particularly limited, and for example, a method of bringing the etchant into contact with the object by a mode such as dropping, spraying, etc., a method of dipping the object in the etchant, and the like can be adopted. In the present invention, a method of bringing the etchant into contact with the object by means of spraying is preferably adopted.

A use temperature of the etchant is preferably a temperature of not higher than 50° C., more preferably from 20 to 50° C., still more preferably from 20 to 40° C., and especially preferably from 25 to 35° C. When the temperature of the etchant is 50° C. or higher, though the etching rate increases, the stability of the liquid is deteriorated, and it is difficult to keep the etching condition constant. By regulating the temperature of the etchant to not higher than 50° C., a change of composition of the etchant is controlled small, and a stable etching rate can be obtained. Also, when the temperature of the etchant is 20° C. or higher, the etching rate does not become excessively slow, and the production efficiency is not remarkably lowered.

As shown in FIG. 2D, in etching the copper layer 106 in the etching step of Step A6, the side face of the nickel layer 112 is exposed to the etchant. In such case, when the etchant of the present invention is used, the formation of a concave 117 to be caused due to the matter that the nickel layer 112 is etched as shown in FIG. 2H does not occur, and it is possible to selectively etch only the copper layer 106. Also, in view of the fact that the etchant of the present invention has satisfactory etching performances, the generation of a residue 116 of the copper layer as shown in FIG. 2G does not occur.

Figure 2F:
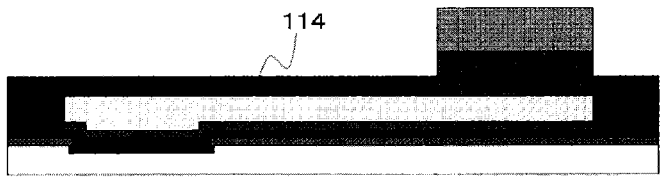
Figure 2G:
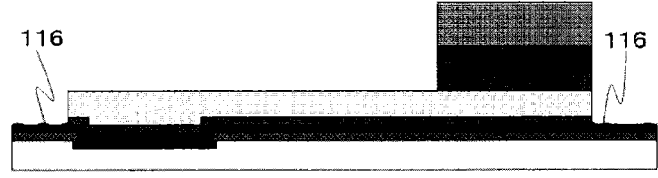
Figure 2H:
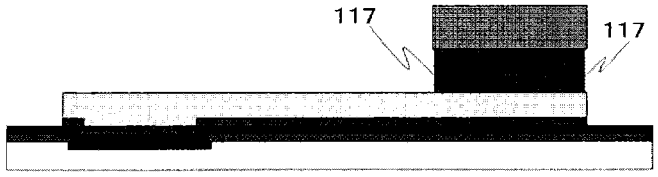

In Manufacturing Method A of the present invention, as shown in FIG. 2F, an insulating film 114 can be further formed in other portion than the area where the bump electrode is formed. For the formation of the insulating film 114, an insulating organic material such as epoxy resins, polyimide resins, etc., or the like is preferably used.

<<Manufacturing Method B of Semiconductor Device>>

A second embodiment of the manufacturing method of a semiconductor device of the present invention (hereinafter referred to as "Manufacturing Method B") includes a seed layer forming step B1; a photoresist forming step 32; a redistribution layer forming step B3; an etching step B4 using the etchant of the present invention; an insulating film forming step B5; and a bump electrode forming step B6 in this order. Manufacturing Method B of the present invention is described in detail by reference to FIGS. 3A-3G and FIGS. 4A-4F.

(Step B1)

Figure 3A:
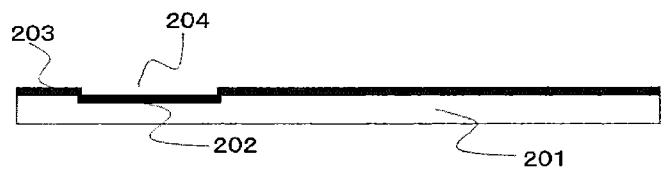
FIGS. 3A-3G are sectional schematic views of every step of a semiconductor device for explaining Manufacturing Method B of a semiconductor device having a bump electrode of the present invention.
Figure 3B:
Figure 3C:

Step B1 is a seed layer forming step of providing, on a semiconductor substrate 201 having an electrode 202 provided therewith, an insulating film 203 having an opening 204 from which the electrode 202 is exposed, and further forming a seed layer on the opening 204 and the insulating film 203. Step B1 is the same as the foregoing Step A1 as shown in FIGS. 3A-3C.

(Step B2)

Figure 3D:
Figure 3E:

Step B2 is a photoresist forming step of opening a region including an area which is provided on the electrode 202 of the seed layer composed of a titanium layer 205 and a copper layer 206 as provided in Step B1 and an area for forming a bump electrode and forming a photoresist 207 having an opening 208 for exposing the seed layer. Step B2 is the same as the foregoing Step A2 as shown in FIGS. 3D-3E.

(Step B3)

Figure 3F:
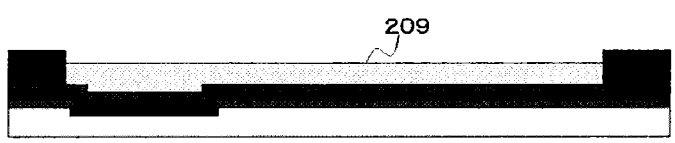
Figure 3G:
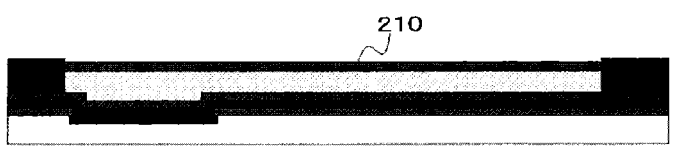

Step B3 is a redistribution layer forming step of providing a wiring on the opening 208 to perform redistribution. For the wiring, a material such as copper, nickel, etc. is used. For example, as shown in FIGS. 3F-3G, the redistribution layer can be formed by successively laminating a copper layer 209 and a nickel layer 210. Also, the wiring is in general provided by an electrolytic plating treatment of copper or nickel.

(Step B4)

Figure 4A:
FIGS. 4A-4F are sectional schematic views of every step of a semiconductor device for explaining Manufacturing Method B of a semiconductor device having a bump electrode of the present invention.
Figure 4B:
Figure 4C:

Step B4 is an etching step of after removing the photoresist 207 as shown in FIG. 4A, further etching an exposed portion which is not covered by the wiring such as the copper layer 209 and the nickel layer 210 in the seed layer such as the titanium layer 205, the copper layer 206, etc. as shown in FIGS. 4B-4C. In the etching step, it is required that the etchant of the present invention is used. By using the etchant of the present invention, the control of hydrogen peroxide in the etchant is easy; an appropriate etching rate and satisfactory etching performances are obtained; and it is possible to selectively etch copper without etching nickel. Various conditions of etching in Step B4 are the same as those in Step A6.

As shown in FIG. 4B, in etching the copper layer 206 in the etching step of Step B4, the nickel layer 210 is exposed to the etchant. In such case, when the etchant of the present invention is used, the formation of a shoulder cutting 214 to be caused due to the matter that the nickel layer 210 is etched as shown in FIG. 2E does not occur, and it is possible to selectively etch only the copper layer 206. Also, in view of the fact that the etchant of the present invention has satisfactory etching performances, the generation of a residue of the copper layer does not occur.

(Step B5)

Figure 4D:
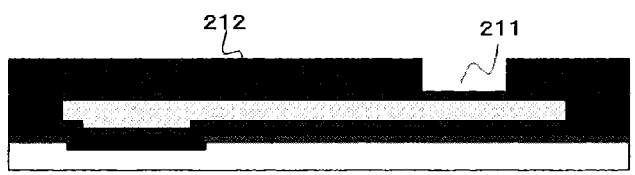
Figure 4E:
Figure 4F:
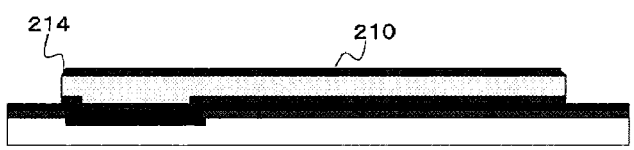

As shown in FIG. 4D, Step B5 is an insulating film forming step of forming an insulating film 212 having an opening 211 in a region for providing a bump electrode.

For the formation of the insulating film 212, an organic insulating material such as epoxies, polyimides, etc. is preferably used. The insulating film 212 is formed by coating the organic insulating material by means of spin coating or the like and providing the opening 211 for exposing a redistribution layer portion (the nickel layer 210 in the case of FIGS. 3A-3G and FIGS. 4A-4F). Though a formation method thereof varies depending upon the organic insulating material which is used for the insulating film 212, for example, after coating the organic insulating material, a photoresist is coated, and after exposing with light and developing the photoresist, the insulating film 212 is etched to provide the opening 211; or in the case where the organic insulating material is a photosensitive material, after coating the organic insulating material, the resultant is directly exposed with light and developed, whereby the insulating film 212 having the opening 211 can be formed, too.

(Step B6)

Step B6 is a bump electrode forming step of forming a bump electrode 213 in the opening 211. The bump electrode 213 can be provided by mounting a solder ball.

<<Manufacturing Method C of Semiconductor Device>>

A third embodiment of the manufacturing method of a semiconductor device of the present invention (hereinafter referred to as "Manufacturing Method C") includes a seed layer forming step C1; a photoresist forming step C2; a bump electrode forming step C3; and an etching step C4 using the etchant of the present invention in this order. Manufacturing Method C of the present invention is described in detail by reference to FIGS. 5A-5E and FIGS. 6A-6F.

(Step C1)

Figure 5A:
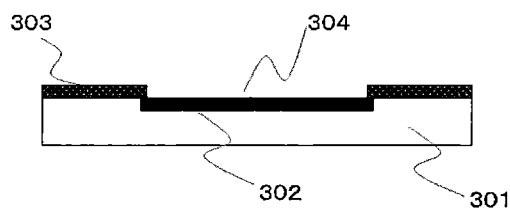
FIGS. 5A-5E are sectional schematic views of every step of a semiconductor device for explaining Manufacturing Method C of a semiconductor device having a bump electrode of the present invention.
Figure 5B:
Figure 5C:

Step C1 is a seed layer forming step of providing, on a semiconductor substrate 301 having an electrode 302 provided therewith, an insulating film 303 having an opening 304 from which the electrode 302 is exposed, and further forming a seed layer on the opening 304 and the insulating film 303. Step C1 is the same as the foregoing Step A1 or Step B1 as shown in FIGS. 5A-5C.

(Step C2)

Figure 5D:
Figure 5E:
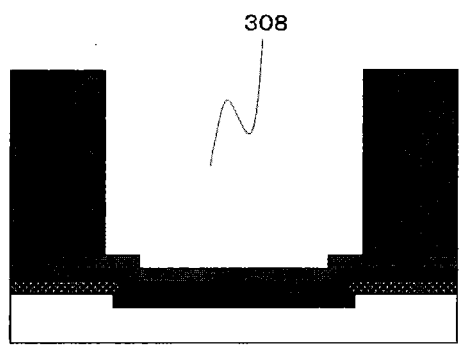

Step C2 is a photoresist forming step of opening a region including an area which is provided on the electrode 302 of the seed layer composed of a titanium layer 305 and a copper layer 306 as provided in Step C1 and forming a photoresist 307 having an opening 308 for exposing the seed layer. Step C2 is the same as the foregoing Step A2 or Step B2 as shown in FIGS. 5D-5E.

(Step C3)

Figure 6A:
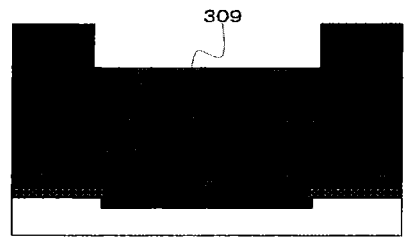
FIGS. 6A-6F are sectional schematic views of every step of a semiconductor device for explaining Manufacturing Method C of a semiconductor device having a bump electrode of the present invention.
Figure 6B:
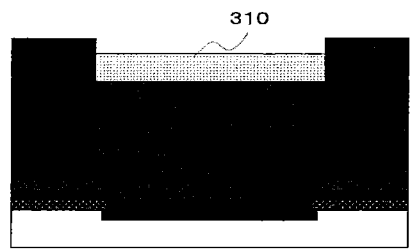

Step C3 is a bump electrode forming step of forming a bump electrode having at least one layer of a nickel layer 309 composed of nickel in the opening 309. Step C3 is the same as Step A5, except for the formation of the opening 111, and as shown in FIGS. 6A-6B, after providing the nickel layer 309, a gold layer 310 is provided, whereby the bump electrode can be formed.

(Step C4)

Figure 6C:
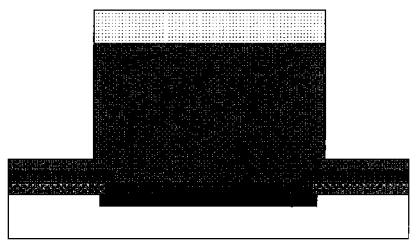
Figure 6D:
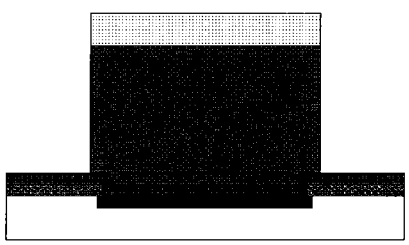
Figure 6E:
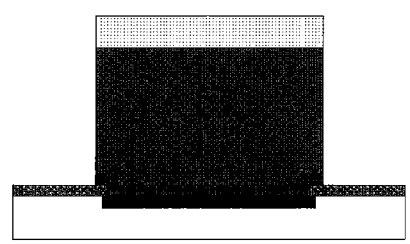

Step C4 is an etching step of after removing the photoresist 307 as shown in FIG. 6C, further etching an exposed portion which is not covered by the bump electrode such as the nickel layer 309 and the gold layer 310 in the seed layer such as the titanium layer 305, the copper layer 306, etc. as shown in FIGS. 6D-6E. In the etching step, it is required that the etchant of the present invention is used. By using the etchant of the present invention, the control of hydrogen peroxide in the etchant is easy; an appropriate etching rate and satisfactory etching performances are obtained; and it is possible to selectively etch copper without etching nickel. Various conditions of etching in Step C4 are the same as those in Step A6.

Figure 6F:
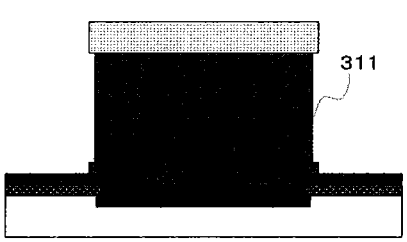
Figure 7A:
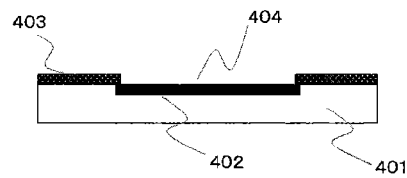
FIGS. 7A-7G are sectional schematic views of every step of a semiconductor device for explaining Manufacturing Method D of a semiconductor device having a bump electrode of the present invention.
Figure 7B:
Figure 7C:
Figure 7D:
Figure 7E:
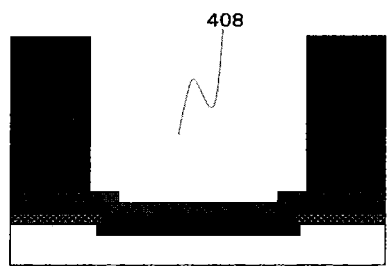
Figure 7F:
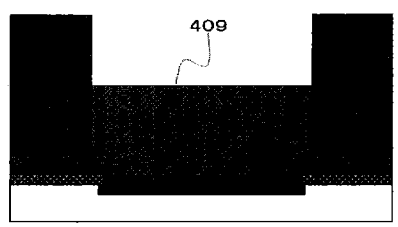
Figure 7G:
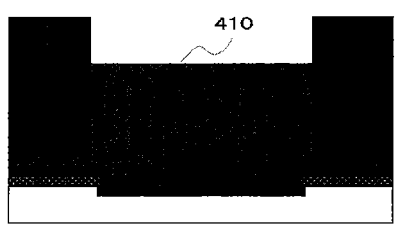

As shown in FIG. 6D, in etching the copper layer 306 in the etching step of Step C4, the nickel layer 309 is exposed to the etchant. In such case, when the etchant of the present invention is used, the formation of a concave 311 to be caused due to the matter that the nickel layer 309 is etched as shown in FIG. 6F does not occur, and it is possible to selectively etch only the copper layer 306. Also, in view of the fact that the etchant of the present invention has satisfactory etching performances, the generation of a residue of the copper layer does not occur.

<<Manufacturing Method D of Semiconductor Device>>

A fourth embodiment of the manufacturing method of a semiconductor device of the present invention (hereinafter referred to as "Manufacturing Method D") includes a seed layer forming step D1; a photoresist forming step D2; a bump electrode forming step D3; and an etching step D4 using the etchant of the present invention in this order. The respective steps of Manufacturing Method D of the present invention are shown in FIGS. 7A-7G and FIGS. 8A-8E.

As shown in FIGS. 7A-7G and FIGS. 8A-8E, Manufacturing Method D is the same as Manufacturing Method C, except that in the bump electrode forming step D3, a bump electrode composed of three layers of a copper layer 409, a nickel layer 410, and a gold layer 411 is formed.

Figure 8A:
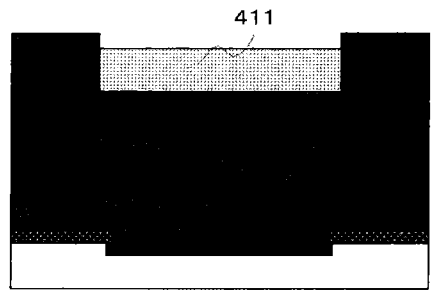
FIGS. 8A-8E are sectional schematic views of every step of a semiconductor device for explaining Manufacturing Method D of a semiconductor device having a bump electrode of the present invention.
Figure 8B:
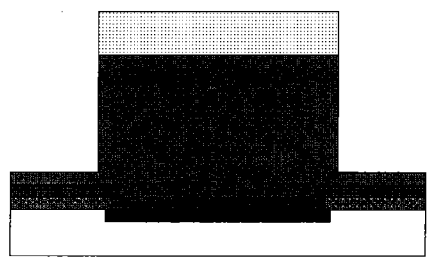
Figure 8C:
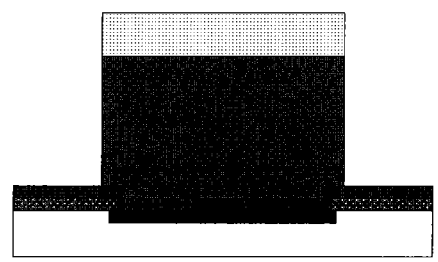

As shown in FIG. 8C, in etching a copper layer 406 in the etching step of Step D4, the nickel layer 410 is exposed to the etchant. In such case, when the etchant of the present invention is used, the formation of a concave 412 to be caused due to the matter that the nickel layer 410 is etched as shown in FIG. 8E does not occur, and it is possible to selectively etch only the copper layer 406. Also, in view of the fact that the etchant of the present invention has satisfactory etching performances, the generation of a residue of the copper layer does not occur.

Among the manufacturing methods of the present invention, according to Manufacturing Methods A and B, the redistribution for forming a wiring on an electrode of a semiconductor substrate having the electrode is achieved, thereby obtaining a semiconductor device having a bump electrode. According to these manufacturing methods, it is possible to use a semiconductor substrate having a narrow pitch such that an electrode-to-electrode pitch is not more than 150 µm, preferably not more than 100 µm, and more preferably not more than 50 µm. Also, a semiconductor device having a narrow pitch such that a bump electrode-to-bump electrode pitch is not more than 500 µm, preferably not more than 250 µm, and more preferably not more than 200 µm can be obtained. Accordingly, the semiconductor device obtained by the manufacturing method of the present invention can thoroughly cope with downsizing, high integration and multi-functionalization in recent years.

EXAMPLES

Next, the present invention is described in more detail with reference to the following Examples, but it should be construed that the present invention is not limited to these Examples at all.

Evaluation Methods

Evaluation Item 1

Calculation of Etching Rate of Copper Layer (Wiring)

A silicon substrate on which copper had been deposited by means of sputtering (thickness of copper film: 5,000 angstrom) was dipped in an etchant of each of the Examples and Comparative Examples at 30° C. for 2 minutes, and a change in a film thickness before and after dipping was measured using a fluorescent X-ray analyzer ("SEA2110L", manufactured by SII Nano Technology Inc.), from which was then calculated an etching rate (µm/min).

Evaluation Item 2

Calculation of Etching Rate of Nickel

A substrate obtained by depositing nickel on a steel material by means of electrolytic plating (thickness of nickel film: 5 µm) was dipped in an etchant of each of the Examples and Comparative Examples at 30° C. for one hour, and a weight before and after dipping was measured, from which was then calculated an etching rate (angstrom/min).

Evaluation Item 3

Evaluation of Stability of Etchant (Hydrogen Peroxide)

At the time of allowing an etchant of each of the Examples and Comparative Examples to stand under a condition at 50° C. for one week, a decomposition rate of hydrogen peroxide in each of the etchants was determined and evaluated according to the following criteria. It was decided that when the decomposition rate is less than 10%, the etchant is excellent in stability; when the decomposition rate is 10% or more and less than 20%, although the etchant is not sufficient in view of economy and is required to take care of control of the liquid in view of safety, it does not involve a problem from the standpoint of practical use; and when the decomposition rate is 20% or more, the etchant is a level at which it cannot be used.

A: The decomposition rate is less than 10%

B: The decomposition rate is 10% or more and less than 20%.

C: The decomposition rate is 20% or more.

Evaluation Item 4

Evaluation of Etching Using Semiconductor Substrate

Semiconductor devices were manufactured according to the procedures of Manufacturing Methods A to D by using an etchant of each of the Examples and Comparative Examples. At that time, the etching temperature was set to 30° C.; and the etching time was set to be two times a time obtained through calculation by dividing a film of copper (film thickness: 3,000 angstrom) provided as a seed layer of the semiconductor device by means of sputtering, by the etching rate obtained in the foregoing Evaluation Item 1.

With respect to the obtained semiconductor devices, the state of a concave (in the case of Manufacturing Methods A, C and D) or a shoulder cutting (in the case of Manufacturing Method B) of a nickel layer provided by means of electrolytic plating, and a residual state of the copper layer provided as a seed layer after etching were evaluated according to the following criteria, respectively.

(Re: State of Concave or Should Cutting of Nickel Layer)

A: The concave or should cutting of the nickel layer was not confirmed at all.

B: The concave or should cutting of the nickel layer was slightly confirmed, but there is not involved a problem from the standpoint of practical use.

C: The concave or should cutting of the nickel layer was remarkable, so that the resulting semiconductor device cannot be used.

(Residual State of Copper Layer)

A: After etching, the survival of the copper layer was not confirmed at all.

B: After etching, the survival of the copper layer was slightly confirmed, and a hindrance was generated from the standpoint of practical use.

C: After etching, the survival of the copper layer was remarkable, so that the resulting semiconductor device cannot be used.

<<Preparation of Processing Liquid>>

An etchant to be used in each of the Examples and Comparative Examples was prepared according to a blending composition (% by mass) shown in Table 1 or 2.

Examples A1 to A51 and Comparative Examples A1 to A49

Manufacture of Semiconductor Device According to Manufacturing Method A

Semiconductor devices each having an electrode and a bump electrode were fabricated according to the procedures of Manufacturing Method A (FIGS. 1A-1H and FIGS. 2A-2F). Here, in the etching step shown in FIGS. 2C-2E, etching of the photoresist 110, the copper layer 106, and the titanium layer 105 was successively carried out by using the etchant of each of the Examples and Comparative Examples.

Also, all of the titanium layer 105 and the copper layer 106 are provided by means of sputtering, and all of layer thicknesses thereof are 3,000 angstrom; and all of the copper layer 109 of the redistribution layer and the nickel layer 112 and the gold layer 103 each forming a bump electrode are provided by means of electrolytic plating, and layer thicknesses thereof are 3 μm, 2 μm and 5 μm, respectively. With respect to the semiconductor devices obtained in the respective Examples and Comparative Examples, the results evaluated according to the foregoing Evaluation Item 4 are shown in Tables 1 and 2. Also, with respect to the etchants used in the respective Examples and Comparative Examples, the results evaluated according to the foregoing Evaluation Items 1 to 3 are shown in Tables 1 and 2.

Examples B1 to B51 and Comparative Examples B1 to B49

Semiconductor devices each having an electrode and a bump electrode were fabricated according to the procedures of Manufacturing Method B (FIGS. 3A-3G and FIGS. 4A-4E). All of the titanium layer 205 and the copper layer 106 are provided by means of sputtering, and all of layer thicknesses thereof are 3,000 angstrom; and all of the copper layer 209 and the nickel layer 210 provided in the redistribution step are provided by means of electrolytic plating, and layer thicknesses thereof are 3 μm and 2 μm, respectively.

In the etching step shown in (FIGS. 4A-4C), etching of the photoresist 207, the copper layer 206, and the titanium layer 205 was successively carried out by using an etchant. Here, the etchants used in Examples B1 to B51 and Comparative Examples B1 to B49 are the same as the etchants used in Examples A1 to A51 and Comparative Examples A1 to A49, respectively, and the evaluations of Evaluation Items 1 to 3 are also the same.

The semiconductor devices obtained in the respective Examples and Comparative Examples were evaluated according to the foregoing Evaluation Item 4. As a result, Examples B1 to B51 and Comparative Examples B1 to B49 revealed the same results as those of Examples A1 to A51 and Comparative Examples A1 to A49 using the same etchants, respectively. These results are shown in Tables 1 and 2.

Examples C1 to C51 and Comparative Examples C1 to C49

Semiconductor devices each having an electrode and a bump electrode were fabricated according to the procedures of Manufacturing Method C (FIGS. 5A-5E and FIGS. 6A-6E). All of the titanium layer 305 and the copper layer 306 are provided by means of sputtering, and all of layer thicknesses thereof are 3,000 angstrom; and all of the nickel layer 309 and the gold layer 310 each provided as the bump electrode are provided by means of electrolytic plating, and layer thicknesses thereof are 3 μm and 10 μm, respectively.

In the etching step shown in FIGS. 6C-6E, etching of the photoresist 307, the copper layer 306, and the titanium layer 305 was successively carried out by using an etchant. Here, the etchants used in Examples C1 to C51 and Comparative Examples C1 to C49 are the same as the etchants used in Examples A1 to A51 and Comparative Examples A1 to A49, respectively, and the evaluations of Evaluation Items 1 to 3 are also the same.

The semiconductor devices obtained in the respective Examples and Comparative Examples were evaluated according to the foregoing Evaluation Item 4. As a result, Examples C1 to C51 and Comparative Examples C1 to C49 revealed the same results as those of Examples A1 to A51 and Comparative Examples A1 to A49 using the same etchants, respectively. These results are shown in Tables 1 and 2.

Examples D1 to D51 and Comparative Examples D1 to D49

Semiconductor devices each having an electrode and a bump electrode were fabricated according to the procedures of Manufacturing Method D (FIGS. 7A-7G and FIGS 8A-8D). All of the titanium layer 405 and the copper layer 406 are provided by means of sputtering, and all of layer thicknesses thereof are 3,000 angstrom; and all of the copper layer 409, the nickel layer 410, and the gold layer 411 each provided as the bump electrode are provided by means of electrolytic plating, and layer thicknesses thereof are 10 μm, 3 μm and 5 μm, respectively.

Figure 8D:
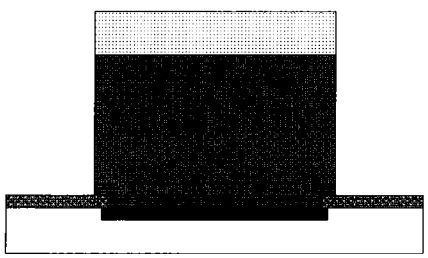
Figure 8E:
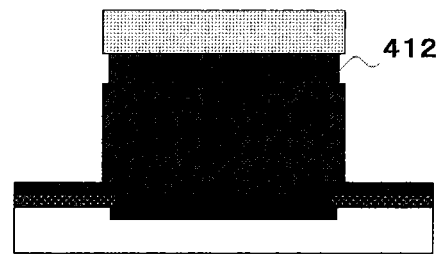

In the etching step shown in FIGS. 8B-8D, etching of the photoresist 407, the copper layer 406, and the titanium layer 405 was successively carried out by using an etchant. Here, the etchants used in Examples D1 to D51 and Comparative Examples D1 to D49 are the same as the etchants used in Examples A1 to A51 and Comparative Examples A1 to A49, respectively, and the evaluations of Evaluation Items 1 to 3 are also the same.

The semiconductor devices obtained in the respective Examples and Comparative Examples were evaluated according to the foregoing Evaluation Item 4. As a result, Examples D1 to D51 and Comparative Examples D1 to D49 revealed the same results as those of Examples A1 to A51 and Comparative Examples A1 to A49 using the same etchants, respectively. These results are shown in Tables 1 and 2.

TABLE 1

| | $H_2O_2$ Concentration (% by mass) | Organic acid component Kind | Organic acid component Concentration (% by mass) | Water Concentration (% by mass) | $H_2O_2$/ organic acid (molar ratio) | Etching rate Sputtered copper (μm/min) | Etching rate Electrolyzed Ni (angstrom/min) | Stability of $H_2O_2$ | Etching time (sec) | Etching evaluation Nickel layer Concave | Etching evaluation Copper layer Survival |
|---|---|---|---|---|---|---|---|---|---|---|---|
| Example | | | | | | | | | | | |
| A to D 1 | 10 | Citric acid | 15 | 75 | 3.8 | 1.0 | <50 | B | 36 | A | A |
| A to D 2 | 10 | Citric acid | 12 | 78 | 4.7 | 1.0 | <50 | B | — | — | — |
| A to D 3 | 8 | Citric acid | 15 | 77 | 3.0 | 0.8 | <50 | B | — | — | — |
| A to D 4 | 8 | Citric acid | 10 | 82 | 4.5 | 0.8 | <50 | B | — | — | — |
| A to D 5 | 8 | Citric acid | 9 | 83 | 5.0 | 0.8 | <50 | B | 45 | A | A |
| A to D 6 | 6 | Citric acid | 15 | 79 | 2.3 | 0.6 | <50 | A | — | — | — |
| A to D 7 | 6 | Citric acid | 10 | 84 | 3.4 | 0.6 | <50 | A | 60 | A | A |
| A to D 8 | 6 | Citric acid | 7 | 87 | 4.8 | 0.6 | <50 | A | 60 | A | A |
| A to D 9 | 5 | Citric acid | 15 | 80 | 1.9 | 0.5 | <50 | A | — | — | — |
| A to D 10 | 5 | Citric acid | 10 | 85 | 2.8 | 0.5 | <50 | A | — | — | — |
| A to D 11 | 5 | Citric acid | 6 | 89 | 4.7 | 0.5 | <50 | A | 72 | A | A |
| A to D 12 | 4 | Citric acid | 6 | 90 | 3.8 | 0.4 | <50 | A | 90 | A | A |
| A to D 13 | 4 | Citric acid | 5 | 91 | 4.5 | 0.4 | <50 | A | — | — | — |
| A to D 14 | 3 | Citric acid | 15 | 82 | 1.1 | 0.3 | <50 | A | — | — | — |
| A to D 15 | 3 | Citric acid | 10 | 87 | 1.7 | 0.3 | <50 | A | — | — | — |
| A to D 16 | 3 | Citric acid | 5 | 92 | 3.4 | 0.3 | <50 | A | — | — | — |
| A to D 17 | 3 | Citric acid | 4 | 93 | 4.2 | 0.3 | <50 | A | 120 | A | A |
| A to D 18 | 2 | Citric acid | 15 | 83 | 0.8 | 0.2 | <50 | A | — | — | — |
| A to D 19 | 2 | Citric acid | 10 | 88 | 1.1 | 0.2 | <50 | A | — | — | — |
| A to D 20 | 2 | Citric acid | 3 | 95 | 3.8 | 0.2 | <50 | A | 180 | A | A |
| A to D 21 | 1 | Citric acid | 10 | 89 | 0.6 | 0.2 | <50 | A | — | — | — |
| A to D 22 | 1 | Citric acid | 5 | 94 | 1.1 | 0.1 | <50 | A | — | — | — |
| A to D 23 | 1 | Citric acid | 2 | 97 | 2.8 | 0.1 | <50 | A | 360 | A | A |
| Comparative Example | | | | | | | | | | | |
| A to D 1 | 10 | Citric acid | 11 | 79 | 5.1 | 1.0 | <50 | C | — | — | — |
| A to D 2 | 10 | Citric acid | 10 | 80 | 5.7 | 1.0 | <50 | C | — | — | — |
| A to D 3 | 10 | Citric acid | 5 | 85 | 11.3 | 1.0 | <50 | C | — | — | — |
| A to D 4 | 8 | Citric acid | 8 | 84 | 5.7 | 0.8 | <50 | B | 45 | A | B |
| A to D 5 | 8 | Citric acid | 5 | 87 | 9.0 | 0.8 | <50 | C | — | — | — |
| A to D 6 | 6 | Citric acid | 6 | 88 | 5.7 | 0.6 | <50 | A | 60 | A | B |
| A to D 7 | 6 | Citric acid | 5 | 89 | 6.8 | 0.6 | <50 | B | 60 | A | B |
| A to D 8 | 5 | Citric acid | 5 | 90 | 5.7 | 0.5 | <50 | B | 72 | A | B |
| A to D 9 | 5 | Citric acid | 4 | 91 | 7.1 | 0.5 | <50 | B | — | — | — |
| A to D 10 | 5 | Citric acid | 3 | 92 | 9.4 | 0.4 | <50 | B | — | — | — |
| A to D 11 | 5 | Citric acid | 2 | 93 | 14.1 | 0.3 | <50 | B | — | — | — |
| A to D 12 | 5 | Citric acid | 1 | 94 | 28.3 | 0.2 | <50 | B | 180 | A | C |
| A to D 13 | 4 | Citric acid | 4 | 92 | 5.7 | 0.4 | <50 | B | 90 | A | B |
| A to D 14 | 3 | Citric acid | 3 | 94 | 5.7 | 0.2 | <50 | B | 180 | A | B |
| A to D 15 | 3 | Citric acid | 2 | 95 | 8.5 | 0.2 | <50 | B | — | — | — |
| A to D 16 | 3 | Citric acid | 1 | 96 | 17.0 | 0.1 | <50 | B | — | — | C |
| A to D 17 | 2 | Citric acid | 2 | 96 | 5.7 | 0.1 | <50 | A | 360 | A | B |
| A to D 18 | 2 | Citric acid | 1 | 97 | 11.3 | <0.1 | <50 | A | — | — | — |
| A to D 19 | 1 | Citric acid | 1 | 98 | 5.7 | <0.1 | <50 | A | — | — | — |
| A to D 20 | 1 | Citric acid | 0.5 | 98.5 | 11.3 | <0.1 | <50 | A | — | — | — |
| A to D 21 | 0.5 | Citric acid | 10 | 89.5 | 0.3 | <0.1 | <50 | A | — | — | — |
| A to D 22 | 0.5 | Citric acid | 5 | 94.5 | 0.6 | <0.1 | <50 | A | — | — | — |

TABLE 1-continued

| | | Organic acid component | | Water | | Etching rate | | | | Etching evaluation | |
|---|---|---|---|---|---|---|---|---|---|---|---|
| | H₂O₂ Concentration (% by mass) | Kind | Concentration (% by mass) | Concentration (% by mass) | H₂O₂/organic acid (molar ratio) | Sputtered copper (μm/min) | Electrolyzed Ni (angstrom/min) | Stability of H₂O₂ | Etching time (sec) | Nickel layer Concave | Copper layer Survival |
| A to D 23 | 5 | Glycolic acid | 8 | 87 | 1.4 | 0.5 | 1,500 | B | 72 | C | C |
| A to D 24 | 5 | Propionic acid | 8 | 87 | 1.4 | <0.1 | <50 | B | — | — | — |
| A to D 25 | 5 | Butyric acid (butanoic acid) | 8 | 87 | 1.6 | <0.1 | <50 | B | — | — | — |
| A to D 26 | 5 | Malonic acid | 8 | 87 | 1.9 | 0.3 | 5,000 | B | 120 | C | C |
| A to D 27 | 5 | Succinic acid | 8 | 87 | 2.2 | — | — | — | Sparingly soluble | — | — |
| A to D 28 | 5 | Tartaric acid | 8 | 87 | 2.8 | 0.2 | <50 | B | 180 | A | C |
| A to D 29 | 5 | Fumaric acid | 8 | 87 | 2.1 | — | — | — | Sparingly soluble | — | — |
| A to D 30 | 5 | Maleic acid | 8 | 87 | 2.1 | 0.7 | 5,000 | B | 51 | — | — |
| A to D 31 | 5 | Diglycolic acid | 8 | 87 | 2.5 | <0.1 | <50 | B | — | — | — |
| A to D 32 | 5 | Glutaric acid | 8 | 87 | 2.4 | 0.2 | <50 | B | 180 | A | C |
| A to D 33 | 5 | Itaconic acid | 8 | 87 | 2.4 | 0.4 | <50 | B | 90 | A | C |

TABLE 2

| | H₂O₂ Concentration (% by mass) | Organic acid component | | Water Concentration (% by mass) | H₂O₂/organic acid (molar ratio) | Etching rate | | Stability of H₂O₂ | Etching time (sec) | Etching evaluation | |
|---|---|---|---|---|---|---|---|---|---|---|---|
| | | Kind | Concentration (% by mass) | | | Sputtered copper (μm/min) | Electrolyzed Ni (angstrom/min) | | | Nickel layer Concave | Copper layer Survival |
| Example | | | | | | | | | | | |
| A to D 24 | 10 | Malic acid | 20 | 70 | 2.0 | 0.9 | <50 | B | 40 | A | A |
| A to D 25 | 10 | Malic acid | 10 | 80 | 3.9 | 0.9 | <50 | B | — | — | — |
| A to D 26 | 10 | Malic acid | 7 | 83 | 5.6 | 0.9 | <50 | B | — | — | — |
| A to D 27 | 8 | Malic acid | 15 | 77 | 2.1 | 0.8 | <50 | B | — | — | — |
| A to D 28 | 8 | Malic acid | 10 | 82 | 3.2 | 0.8 | <50 | B | — | — | — |
| A to D 29 | 8 | Malic acid | 8 | 84 | 3.9 | 0.8 | <50 | B | — | — | — |
| A to D 30 | 8 | Malic acid | 6 | 86 | 5.3 | 0.8 | <50 | B | 45 | A | A |
| A to D 31 | 6 | Malic acid | 15 | 79 | 1.6 | 0.6 | <50 | B | — | — | — |
| A to D 32 | 6 | Malic acid | 10 | 84 | 2.4 | 0.6 | <50 | B | — | — | — |
| A to D 33 | 6 | Malic acid | 5 | 89 | 4.7 | 0.6 | <50 | B | — | — | — |
| A to D 34 | 6 | Malic acid | 4 | 90 | 5.9 | 0.6 | <50 | B | 60 | A | A |
| A to D 35 | 5 | Malic acid | 20 | 75 | 1.0 | 0.5 | <50 | B | — | — | — |
| A to D 36 | 5 | Malic acid | 15 | 80 | 1.3 | 0.5 | <50 | B | — | — | — |
| A to D 37 | 5 | Malic acid | 10 | 85 | 2.0 | 0.5 | <50 | B | — | — | — |
| A to D 38 | 5 | Malic acid | 4 | 91 | 4.9 | 0.5 | <50 | B | — | — | — |
| A to D 39 | 4 | Malic acid | 6 | 90 | 2.6 | 0.4 | <50 | A | — | — | — |
| A to D 40 | 4 | Malic acid | 5 | 91 | 3.2 | 0.4 | <50 | A | 90 | A | A |
| A to D 41 | 4 | Malic acid | 3 | 93 | 5.3 | 0.4 | <50 | A | — | — | — |
| A to D 42 | 3 | Malic acid | 10 | 87 | 1.2 | 0.3 | <50 | A | — | — | — |
| A to D 43 | 3 | Malic acid | 5 | 92 | 2.4 | 0.3 | <50 | A | — | — | — |
| A to D 44 | 3 | Malic acid | 3 | 94 | 3.9 | 0.2 | <50 | A | — | — | — |
| A to D 45 | 3 | Malic acid | 2 | 95 | 5.9 | 0.2 | <50 | A | — | — | — |
| A to D 46 | 2 | Malic acid | 10 | 88 | 0.8 | 0.2 | <50 | A | — | — | — |
| A to D 47 | 2 | Malic acid | 5 | 93 | 1.6 | 0.2 | <50 | A | 180 | A | A |
| A to D 48 | 2 | Malic acid | 2 | 96 | 3.9 | 0.1 | <50 | A | — | — | — |
| A to D 49 | 1 | Malic acid | 10 | 89 | 0.4 | 0.2 | <50 | A | — | — | — |
| A to D 50 | 1 | Malic acid | 5 | 94 | 0.8 | 0.1 | <50 | A | — | — | — |
| A to D 51 | 1 | Malic acid | 2 | 97 | 2.0 | 0.1 | <50 | A | 360 | A | A |

TABLE 2-continued

| | H$_2$O$_2$ Concentration (% by mass) | Organic acid component Kind | Organic acid component Concentration (% by mass) | Water Concentration (% by mass) | H$_2$O$_2$/ organic acid (molar ratio) | Etching rate Sputtered copper (μm/min) | Etching rate Electrolyzed Ni (angstrom/min) | Stability of H$_2$O$_2$ | Etching time (sec) | Etching evaluation Nickel layer Concave | Etching evaluation Copper layer Survival |
|---|---|---|---|---|---|---|---|---|---|---|---|
| Comparative Example | | | | | | | | | | | |
| A to D 34 | 10 | Malic acid | 6 | 84 | 6.6 | 0.9 | <50 | C | — | — | — |
| A to D 35 | 10 | Malic acid | 5 | 85 | 7.9 | 0.9 | <50 | C | — | — | — |
| A to D 36 | 8 | Malic acid | 5 | 87 | 6.3 | 0.8 | <50 | C | — | — | — |
| A to D 37 | 8 | Malic acid | 4 | 88 | 7.9 | 0.8 | <50 | C | — | — | — |
| A to D 39 | 6 | Malic acid | 3 | 91 | 7.9 | 0.6 | <50 | C | — | — | — |
| A to D 38 | 5 | Malic acid | 0.5 | 94.5 | 39.4 | <0.1 | <50 | C | — | — | — |
| A to D 40 | 5 | Malic acid | 3 | 92 | 6.6 | 0.4 | <50 | C | — | — | — |
| A to D 41 | 5 | Malic acid | 2 | 93 | 9.9 | 0.3 | <50 | C | — | — | — |
| A to D 42 | 5 | Malic acid | 1 | 94 | 19.7 | 0.2 | <50 | C | — | — | — |
| A to D 43 | 4 | Malic acid | 2 | 94 | 7.9 | 0.3 | <50 | B | 120 | A | C |
| A to D 44 | 3 | Malic acid | 1 | 96 | 11.8 | 0.1 | <50 | A | 360 | A | C |
| A to D 45 | 2 | Malic acid | 1 | 97 | 7.9 | <0.1 | <50 | A | — | — | — |
| A to D 46 | 1 | Malic acid | 1 | 98 | 3.9 | <0.1 | <50 | A | — | — | — |
| A to D 47 | 1 | Malic acid | 0.5 | 98.5 | 7.9 | <0.1 | <50 | A | — | — | — |
| A to D 48 | 0.5 | Malic acid | 10 | 89.5 | 0.2 | <0.1 | <50 | A | — | — | — |
| A to D 49 | 0.5 | Malic acid | 5 | 94.5 | 0.4 | <0.1 | <50 | A | — | — | — |

INDUSTRIAL APPLICABILITY

The etchant of the present invention is used for the manufacturing step of a semiconductor device using a semiconductor substrate having an electrode.

The invention claimed is:

1. An etchant, consisting essentially of, based on a total mass of the etchant:
   0.75 to 12% by mass of hydrogen peroxide;
   1 to 20% by mass of citric acid; and
   water,
   wherein a molar ratio of the hydrogen peroxide to the citric acid is in the range from 0.3 to 5.

2. The etchant of claim 1, wherein, based on a total mass of the etchant, the content of the hydrogen peroxide is from 1.5 to 7% by mass and the content of the citric acid is from 2 to 15% by mass, and wherein the molar ratio of the hydrogen peroxide to the citric acid is in the range from 0.3 to 5.

3. A method for manufacturing a semiconductor device, the method comprising:
   etching a semiconductor substrate comprising an electrode with the etchant of claim 1.

4. The method of claim 3, wherein the semiconductor device comprises a bump electrode.

5. The method of claim 3, further comprising:
   forming a wiring on the electrode of the semiconductor substrate, to obtain a redistribution layer.

6. The method of claim 3, wherein the semiconductor device comprises a wiring comprising copper.

7. The method of claim 3, wherein, based on a total mass of the etchant, the content of the hydrogen peroxide is from 1.5 to 7% by mass and the content of the citric acid is from 2 to 15% by mass, and wherein the molar ratio of the hydrogen peroxide to the citric acid is in the range from 0.3 to 5.

8. The method of claim 7, wherein the etchant further comprises water.

9. The method of claim 8, further comprising:
   forming a wiring on the electrode of the semiconductor substrate, to obtain a redistribution layer.

10. An etchant, consisting essentially of, based on a total mass of the etchant:
    0.75 to 12% by mass of hydrogen peroxide;
    1.5 to 25% by mass of malic acid; and
    water,
    wherein a molar ratio of the hydrogen peroxide to the malic acid is in the range from 0.2 to 6.

11. The etchant of claim 10, wherein, based on a total mass of the etchant, the content of hydrogen peroxide is from 1.5 to 4.5% by mass and the content of malic acid is from 1 to 15% by mass, and wherein the molar ratio of the hydrogen peroxide to the malic acid is in the range from 0.3 to 6.

12. A method for manufacturing a semiconductor device, the method comprising:
    etching a semiconductor substrate comprising an electrode with the etchant of claim 10.

13. The method of claim 12, wherein, based on a total mass of the etchant, the content of hydrogen peroxide is from 1.5 to 4.5% by mass and the content of malic acid is from 1 to 15% by mass, and wherein the molar ratio of the hydrogen peroxide to the malic acid is in the range from 0.3 to 6.

14. The method of claim 13, wherein the etchant further comprises water.

15. The method of claim 14, wherein the semiconductor device comprises a bump electrode.

16. The method of claim 14, further comprising:
    forming a wiring on the electrode of the semiconductor substrate, to obtain a redistribution layer.

17. The method of claim 14, wherein the semiconductor device comprises a wiring comprising copper.

* * * * *